US012769257B2

(12) United States Patent
Allard et al.

(10) Patent No.: US 12,769,257 B2
(45) Date of Patent: Oct. 20, 2026

(54) REFERENCE-BASED TDC TIMESTAMPING AND TIME DIFFERENCE MEASUREMENTS

(71) Applicant: Renesas Electronics America Inc., Milpitas, CA (US)

(72) Inventors: Veronique Allard, Ottawa (CA); Michael John Rupert, Ottawa (CA)

(73) Assignee: SiTime Corporation, Santa Clara, CA (US)

( * ) Notice: Subject to any disclaimer, the term of this patent is extended or adjusted under 35 U.S.C. 154(b) by 243 days.

(21) Appl. No.: 18/794,471

(22) Filed: Aug. 5, 2024

(65) Prior Publication Data

US 2026/0036943 A1 Feb. 5, 2026

(51) Int. Cl.
*H03M 1/12* (2006.01)
*G04F 10/00* (2006.01)

(52) U.S. Cl.
CPC ............ *G04F 10/005* (2013.01); *H03M 1/12* (2013.01)

(58) Field of Classification Search
CPC ......... H03M 1/12; G04F 10/005; G04F 10/02
USPC .................................................. 341/155, 156
See application file for complete search history.

(56) References Cited

U.S. PATENT DOCUMENTS

| | | | | |
|---|---|---|---|---|
| 2008/0068236 | A1* | 3/2008 | Sheba | G04F 10/005 341/131 |
| 2018/0115406 | A1* | 4/2018 | Moore | H03L 7/00 |
| 2019/0268010 | A1* | 8/2019 | Wu | G04F 10/005 |
| 2021/0194428 | A1* | 6/2021 | Haneda | G04F 10/005 |

* cited by examiner

*Primary Examiner* — Peguy Jean Pierre

(57) ABSTRACT

An apparatus is disclosed that comprises a time-to-digital converter (TDC) circuit. The TDC circuit is configured to obtain an oscillator clock signal and generate a coarse clock signal and a fine clock signal. The TDC circuit is configured to obtain a first clock signal, a second clock signal and a reference clock signal. The TDC circuit is configured to determine a first timestamp based on the first clock signal, the coarse clock signal, the fine clock signal and the reference clock signal and a second timestamp based on the second clock signal, the coarse clock signal, the fine clock signal and the reference clock signal. The TDC circuit is configured to output a time difference between the first and second timestamps that comprises a reference component generated based on the reference clock signal and a coarse and fine component generated based on the coarse and fine clock signals.

20 Claims, 9 Drawing Sheets

REFERENCE-BASED TDC TIMESTAMPING AND TIME DIFFERENCE MEASUREMENTS

BACKGROUND

The present disclosure relates in general to time-to-digital converter (TDC) timestamping in semiconductor devices.

The time difference between the rising edges of two signals can be measured using time-to-digital Converters (TDCs). For example, the rising edges of two signals may be timestamped by sampling a digital counter at each rising edge to obtain a counter value and then subtracting the two counter values. The resolution of the timestamping is often limited by the frequency of the digital counter. In some cases, more accurate timestamping may be performed using interpolation to split the digital counter period into smaller sub-cycles. Interpolation provides time stamps in a combination of coarse clock count values, e.g., based on the digital counter values, and fine clock count values, e.g., based on the interpolation value between each digital counter value.

While the use of coarse and fine clock count values may improve the resolution of the timestamping, the coarse and fine clocks inherit the frequency uncertainty of their frequency source, typically a low-cost oscillator. While the frequency uncertainty of such an oscillator may be acceptable and have a minimal impact for measurements of small time differences, as the size of the time difference grows, the impact of the uncertainty may also increase, resulting in a time difference value having an unacceptable uncertainty that represents a significant portion of the measured time difference.

SUMMARY

In an embodiment, an apparatus is disclosed that comprises a time-to-digital converter (TDC) circuit. The TDC circuit is configured to obtain an oscillator clock signal from an oscillator and generate a coarse clock signal based on the oscillator clock signal. The coarse clock signal has a period linearly related to a period of the oscillator clock signal. The TDC circuit is further configured to generate a fine clock signal based on an interpolation of the coarse clock signal. The fine clock signal has a plurality of periods for each period of the coarse clock signal. The TDC circuit is further configured to obtain a first clock signal, obtain a second clock signal and obtain a reference clock signal. The reference clock signal has a smaller frequency uncertainty than the oscillator clock signal. The TDC circuit is further configured to determine a first timestamp of an edge of the first clock signal based on the first clock signal, the coarse clock signal, the fine clock signal and the reference clock signal and to determine a second timestamp of an edge of the second clock signal based on the second clock signal, the coarse clock signal, the fine clock signal and the reference clock signal. The TDC circuit is further configured to output a time difference between the first and second timestamps. The time difference comprises a reference component generated based on the reference clock signal and a coarse and fine component generated based on the coarse and fine clock signals.

In an embodiment, a method of determining a time difference by a time-to-digital converter circuit is disclosed. The method comprises obtaining an oscillator clock signal from an oscillator and generating a coarse clock signal based on the oscillator clock signal. The coarse clock signal has a period linearly related to a period of the oscillator clock signal. The method further comprises generating a fine clock signal based on an interpolation of the coarse clock signal. The fine clock signal has a plurality of periods for each period of the coarse clock signal. The method further comprises obtaining a first clock signal, obtaining a second clock signal and obtaining a reference clock signal. The reference clock signal has a smaller frequency uncertainty than the oscillator clock signal. The method further comprises determining a first timestamp of an edge of the first clock signal based on the first clock signal, the coarse clock signal, the fine clock signal and the reference clock signal and determining a second timestamp of an edge of the second clock signal based on the second clock signal, the coarse clock signal, the fine clock signal and the reference clock signal. The method further comprises outputting a time difference between the first and second timestamps. The time difference comprises a reference component generated based on the reference clock signal and a coarse and fine component generated based on the coarse and fine clock signals.

In an embodiment, a semiconductor device is disclosed. The semiconductor device comprises an oscillator and a coarse and fine time-to-digital converter circuit that is configured to receive an oscillator clock signal, a first clock signal, a second clock signal and a gated reference clock signal as inputs and to output a first timestamp corresponding to the first clock signal, a second timestamp corresponding to the second clock signal and a third timestamp corresponding to a reference fine clock signal. The semiconductor device further comprises a first clock signal timestamp determination circuit that is configured to receive the first, second and third timestamps and to output a first output timestamp corresponding to the first clock signal based on the received first, second and third timestamps and a second clock signal timestamp determination circuit that is configured to receive the first, second and third timestamps and to output a second output timestamp corresponding to the second clock signal based on the received first, second and third timestamps. The semiconductor device further comprises a time difference determination circuit that is configured to receive the first output timestamp and the second output timestamp and to output a time difference that is determined based on the first output timestamp and the second output timestamp, a gating circuit that is configured to receive a reference clock signal as an input and output the gated reference clock signal based on the received reference clock signal and a controller that is configured to control the operation of one or more of the gating circuit, the first clock signal time stamp determination circuit, the second clock signal time stamp determination circuit and the time difference determination circuit.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

The Reference-Based time-to-digital converter (TDC) timestamping and time difference measurement system and method disclosed herein offers a way to provide more accurate edge timestamping and time difference measurements by combining a coarse and fine TDC using an inexpensive oscillator having a relatively inaccurate frequency with a reference clock having an accurate frequency. The timestamping is performed using both the reference clock and the coarse and fine TDC where, when performing time difference measurements, large time differences are measured in reference cycles and the remaining portion of the offset is measured in coarse and fine TDC units.

Figure 1:
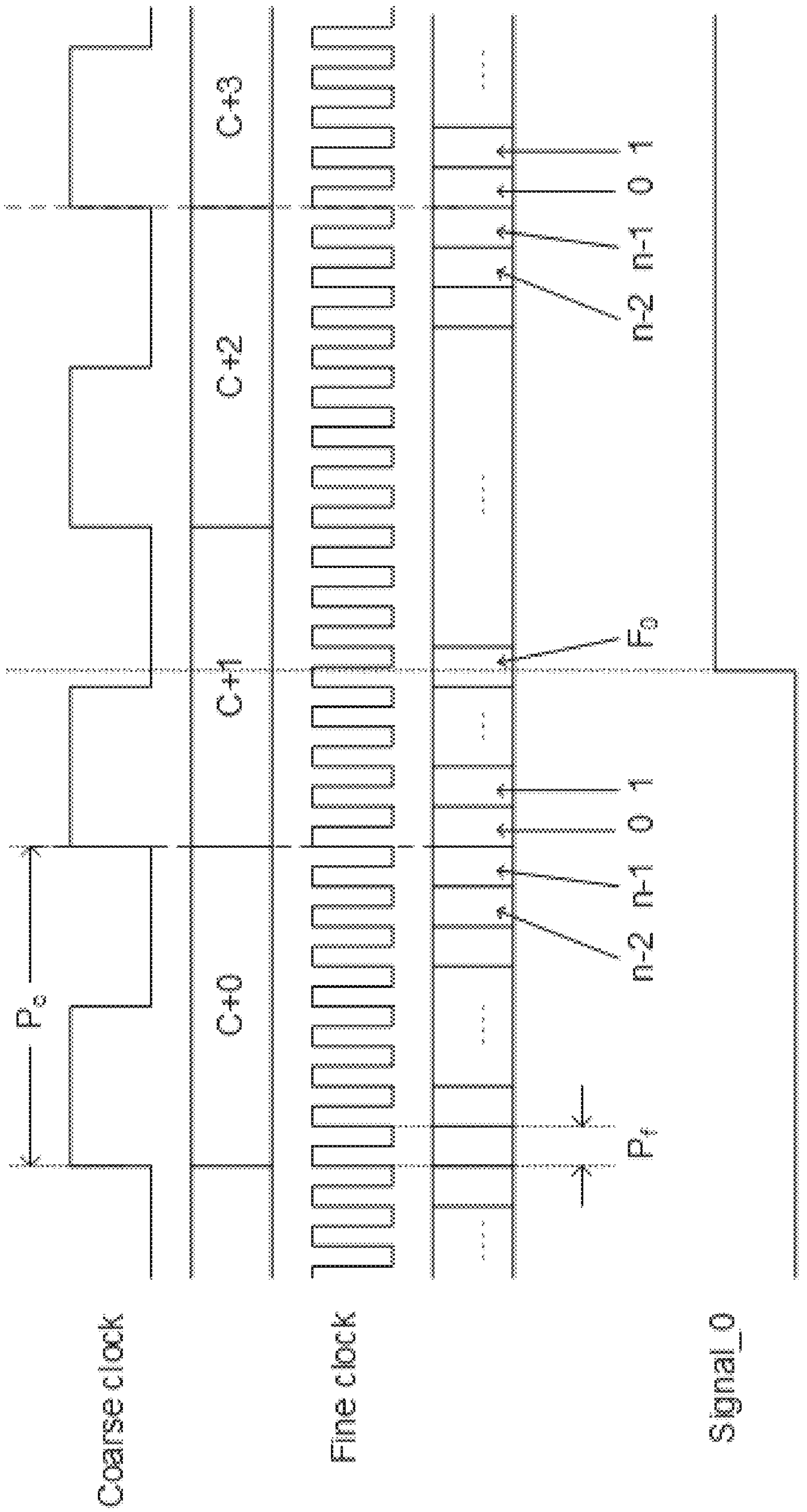
FIG. 1 is a signal diagram illustrating time stamping using a coarse counter and a fine interpolation counter based time-to-digital converter (TDC) according to an embodiment.

With reference to FIG. 1, a coarse clock has coarse clock count values C+0, C+1, C+2, C+3, etc., each corresponding to one coarse clock period $P_c$ and each coarse clock period $P_c$ has a n interpolated fine clock count values, 0, 1, . . . n−2, n−1, each corresponding to one fine clock period $P_f$. A time stamp for the edge time (e.g., rising edge) of a first signal, e.g., Signal_0 as shown in FIG. 1, can be determined using equation (1):

$$\text{Sig\_0\_TS} = P_c \times (C+0) + P_f \times F_0 \tag{1}$$

Where Sig_0_TS is the determined time stamp; $P_c$ is the coarse clock period of the coarse clock signal; C+0 is the coarse clock count value at the rising edge of Signal_0 where each period $P_c$ increments the coarse clock counter by 1, e.g., C+0, C+1, C+2, C+3, etc. as shown in FIG. 1, for example, only one coarse clock period $P_c$ (C+0) has elapsed at the rising edge of Signal_0; $P_f$ is the fine clock period of the interpolated fine clock signal; and $F_0$ is the fine clock count value at the rising edge of Signal_0

If the fine counter period is controlled such that the coarse clock period $P_c$ always has exactly n fine periods $P_f$, the time stamp (Sig_0_TS) for the rising edge of Signal_0 in FIG. 1 can also be determined according to equations (2) and (3):

$$\text{Sig\_0\_TS} = P_f \times (n \times (C+0) + F_0) \tag{2}$$

-continued $$\text{Sig\_0\_TS} = P_f \times (n \times C + F_0) \tag{3}$$

Figure 2:
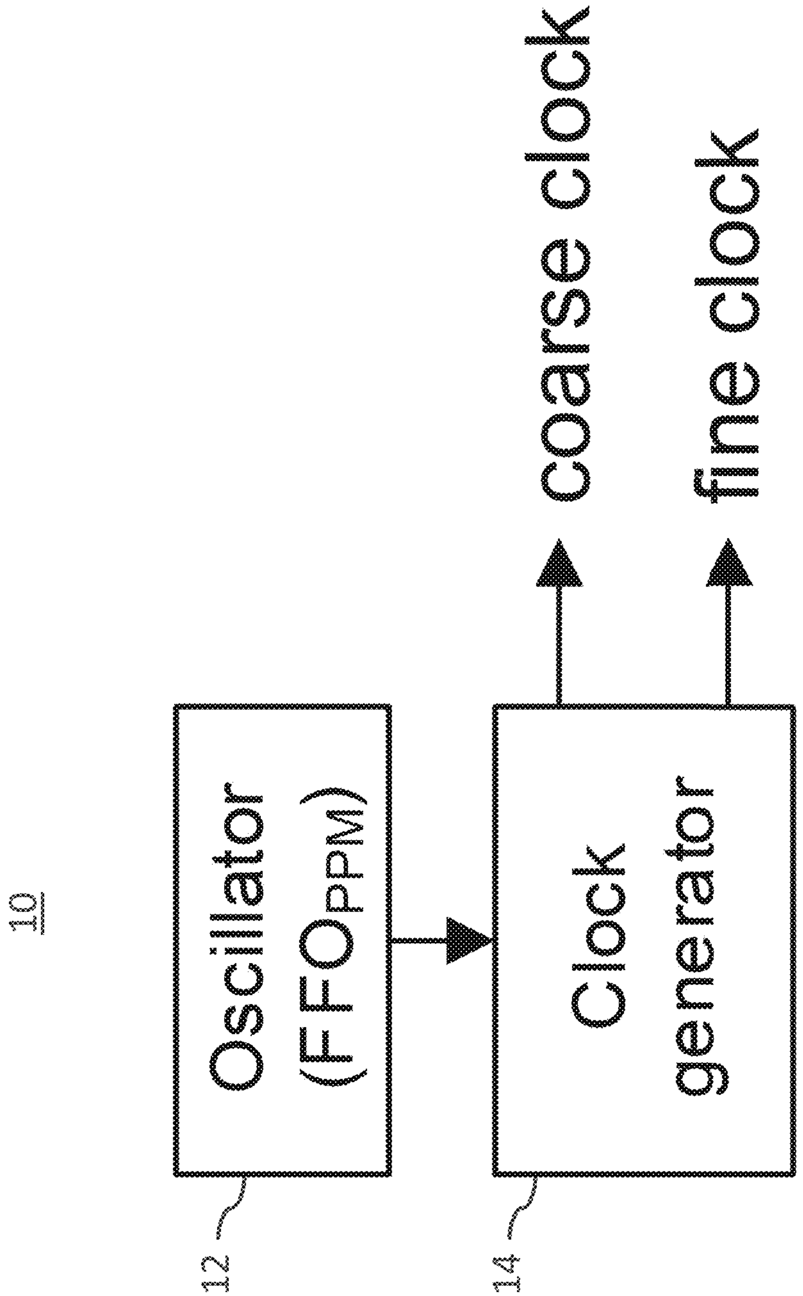
FIG. 2 is a diagram illustrating an example coarse and fine clock generator according to an embodiment.

The coarse and fine clock signals used in FIG. 1 may be sourced from a timing device 10 comprising an oscillator 12 and a clock generator 14. As shown in FIG. 2, for example, oscillator 12 outputs an oscillator clock signal to clock generator 14 which then generates corresponding coarse and fine clock signals based on the oscillator clock signal. Oscillator 12 may comprise, for example, a quartz crystal oscillator or any other oscillator that is configured to output the oscillator clock signal for use by clock generator 14. Depending on the manufacture of oscillator 12, a clock frequency uncertainty ($FFO_{PPM}$) may be present in the oscillator clock signal. Clock generator 14 is configured to generate a coarse clock signal and a fine clock signal based on the oscillator clock signal output by oscillator 12. The coarse and fine clock signals generated by the clock generator 14 may also inherit the same $FFO_{PPM}$ as the oscillator clock signal.

In one embodiment, clock generator 14 may comprise a phase-locked-loop (PLL) signal generator and the coarse and fine clock signals may comprise PLL signals. The coarse and fine clock signals may each include a plurality of clock pulses having the same or uniform pulse widths and having rising edges separated by a time interval, e.g., coarse clock period $P_c$ and fine clock period $P_f$, respectively. In the embodiment of FIG. 1, coarse clock period $P_c$ is linearly related to the oscillator clock signal cycle duration and the fine clock period $P_f$ is equivalent to an interpolated time interval based on the coarse clock signal cycle duration, e.g., dividing the coarse clock signal cycle duration into n fine clock periods $P_f$. Also, the coarse clock period $P_c$ can be linearly related (e.g., varies linearly with) to the period of the oscillator clock signal, and can be shorter or longer than the oscillator clock signal.

Clock frequency error is expressed as fractional frequency offset (FFO). FFO is determined using the equation (4) below, where $F_N$ is the nominal clock frequency in Hertz (Hz) and $F_A$ is the actual clock frequency in Hz:

$$FFO = \frac{(F_A - F_N)}{F_N} \tag{4}$$

Oscillator manufacturers typically specify the frequency uncertainty for oscillators based on the maximum allowed FFO (positive or negative). The uncertainty is specified as plus or minus parts per million (PPM) according to equation (5):

$$FFO_{PPM} = \pm \text{Max}\,|FFO| \times 10^6 \tag{5}$$

The period error of a clock operating with an FFO versus its nominal frequency is given by equation (6) below, where $E_P$ is the error in seconds, $F_A$ is the actual frequency of the clock in Hz and $F_N$ is the nominal frequency of the clock in Hz:

$$E_P = \frac{1}{F_A} - \frac{1}{F_N} \tag{6}$$

Combining equation (4) and equation (6), the period error ($E_P$) of a clock in seconds can be determined using FFO and $F_N$ according to equation (7):

$$E_P = -\frac{FFO}{F_N \times (1 + FFO)} \tag{7}$$

Alternatively, $E_P$ can be determined using the nominal period ($P_N$) of the clock in seconds according to equation (8):

$$E_P = -P_N \times \frac{FFO}{(1 + FFO)} \tag{8}$$

If $FFO_{PPM}$ is smaller than a threshold value, e.g., ≤200 PPM in some embodiments, $E_P$ can be approximated using the simplified expression found in equation (9) below. Any other threshold value may alternatively be utilized including, e.g., 100 PPM, 150 PPM, 250 PPM, 300 PPM or any other value.

$$E_P \approx -P_N \times FFO \tag{9}$$

Combining equations (2), (3) and (9), the error in a time stamp measured according to FIG. 1 can be approximated by the expression in equation (10):

$$E_{TS} \approx -P_f \times (n \times C + F_0) \times FFO \tag{10}$$

The uncertainty in a time stamp (UTS) in seconds measured according to FIG. 1 can be approximated by the expression in equation (11):

$$U_{TS} \approx \pm P_f \times (n \times C + F_0) \times FFO_{PPM} \times 10^{-6} \tag{11}$$

Equation (11) shows that the uncertainty in time stamps measured according to FIG. 1 is proportional to the magnitude of the measurement and the uncertainly of the oscillator frequency.

Figure 3:
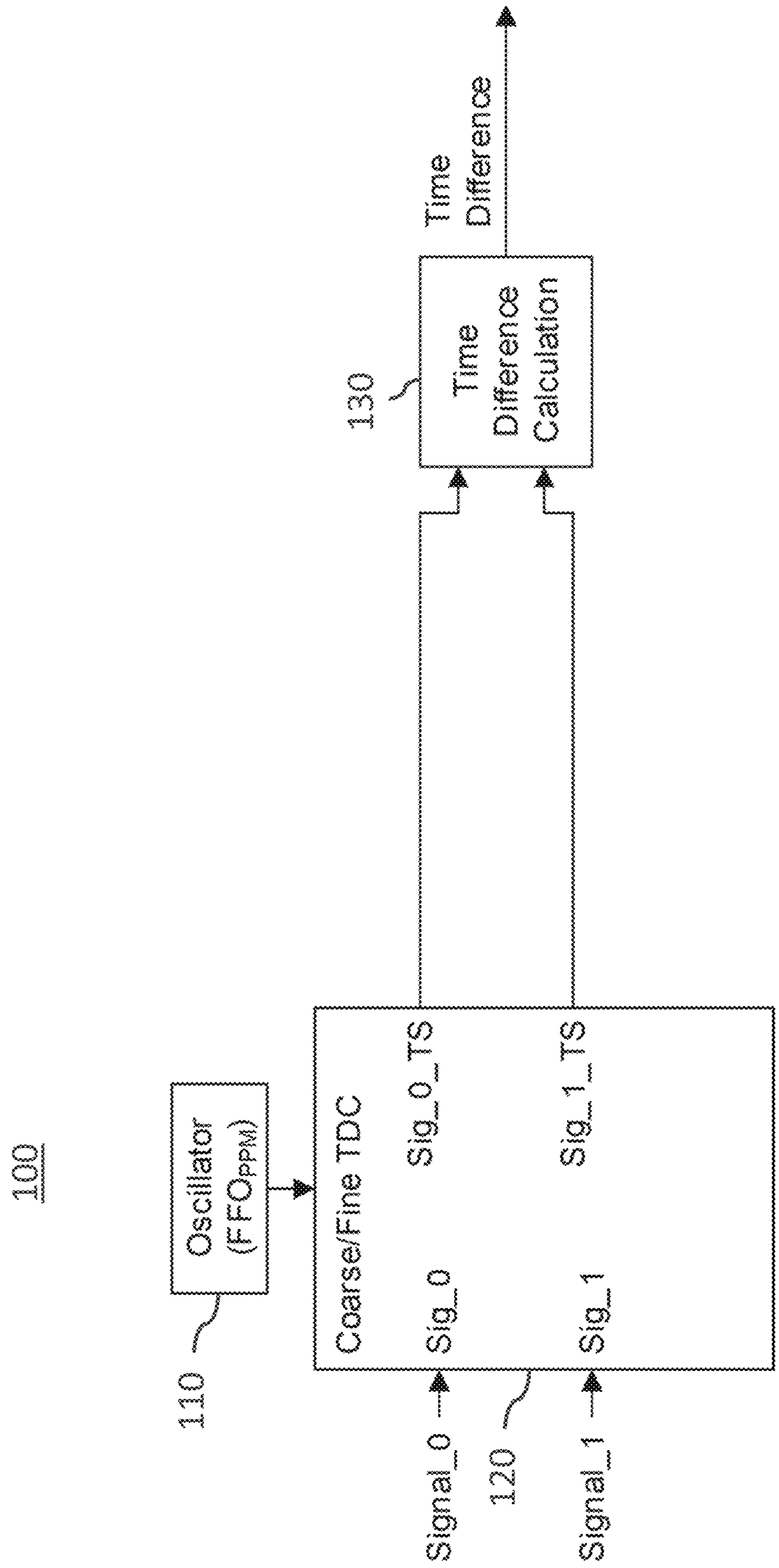
FIG. 3 is a diagram illustrating an example system for determining a time difference between edge times according to an embodiment.
Figure 4:
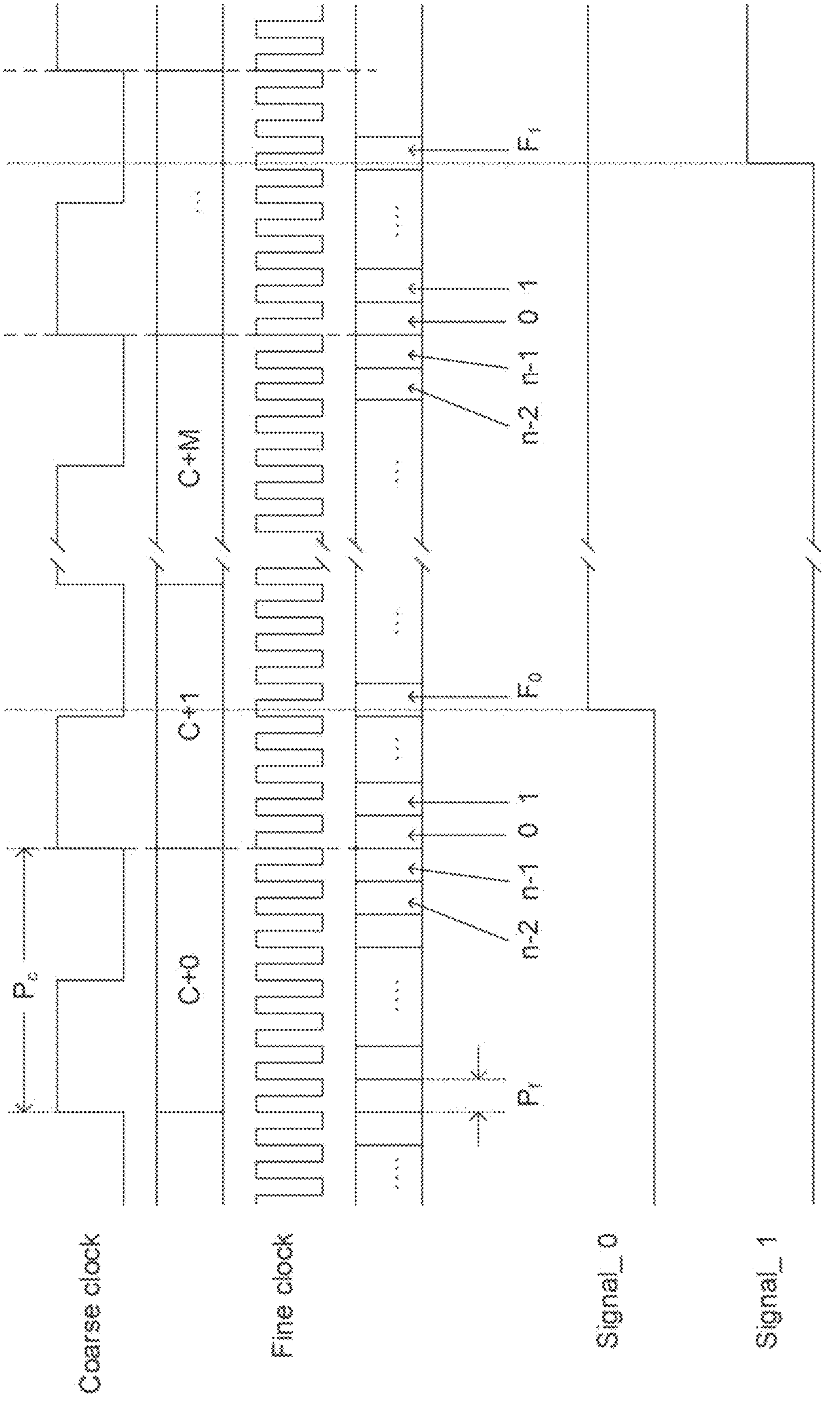
FIG. 4 is a signal diagram illustrating an example time difference determination using a coarse and fine TDC based on the system of FIG. 3 according to an embodiment.

With reference to FIGS. 3 and 4, in many applications, it is useful to determine the time difference between the rising edges of two signals. The difference can be determined using a TDC to time stamp the edge times of both signals and then subtract the time stamps.

FIG. 3 illustrates an example timing device 100 comprising an oscillator 110, a TDC circuit 120 and a time difference determination circuit 130. Oscillator 110 provides an oscillator clock signal to TDC circuit 120. TDC circuit 120 receives the oscillator clock signal, Signal_0 and Signal_1 as inputs and determines the time stamps Sig_0_TS and Sig_1_TS of the rising edge for each of Signal_0 and Signal_1, e.g., as described above. TDC circuit 120 outputs the corresponding time stamps Sig_0_TS and Sig_1_TS to time difference determination circuit 130 which compares the time difference between the time stamp signals to determine the Time_Difference. This process is further illustrated by FIG. 4 and equation (12):

$$\text{Time\_Difference} = P_f \times (n \times M + F_1 - F_0) \tag{12}$$

The error in the Time_Difference given by Equation (12) is the sum of the errors in fine periods during the measurement. Applying Equation (10), the error in the Time_Difference ($E_{TD}$), in seconds, can be approximated by the expression in equation (13):

$$E_{TD} \approx -P_f \times (n \times M + F_1 - F_0) \times FFO \tag{13}$$

The uncertainty in the Time_Difference ($U_{TD}$) in seconds measured according to FIG. 3, FIG. 4 and equation (12) can be approximated by the expression in equation (14):

$$U_{TD} \approx \pm P_f \times (n \times M + F_1 - F_0) \times FFO_{PPM} \times 10^{-6} \tag{14}$$

In some TDC applications, a relatively low-cost oscillator is used as the frequency reference to generate the coarse and fine clock signals. These low-cost oscillators can have a frequency uncertainty ($FFO_{PPM}$) of ±200 PPM and the TDC coarse and fine clock signals generated based on these low-cost oscillators will inherit the same frequency uncertainty. For applications where time difference measurements are small, the $U_{TD}$ will also be small. For example, if the time difference measurement is 1 μs and the $FFO_{PPM}$ is ±200 PPM, then according to equation (14), the $U_{TD}$ will be ±2 ps and this is often low enough to be acceptable. However, for applications where the time difference measurements are large, the $U_{TD}$ will also be large. For example, if the time difference measurement is 1 s and the $FFO_{PPM}$ is ±200 PPM, then according to equation (14), the $U_{TD}$ will be +200 μs, and this is often too high to be acceptable.

Figure 5:
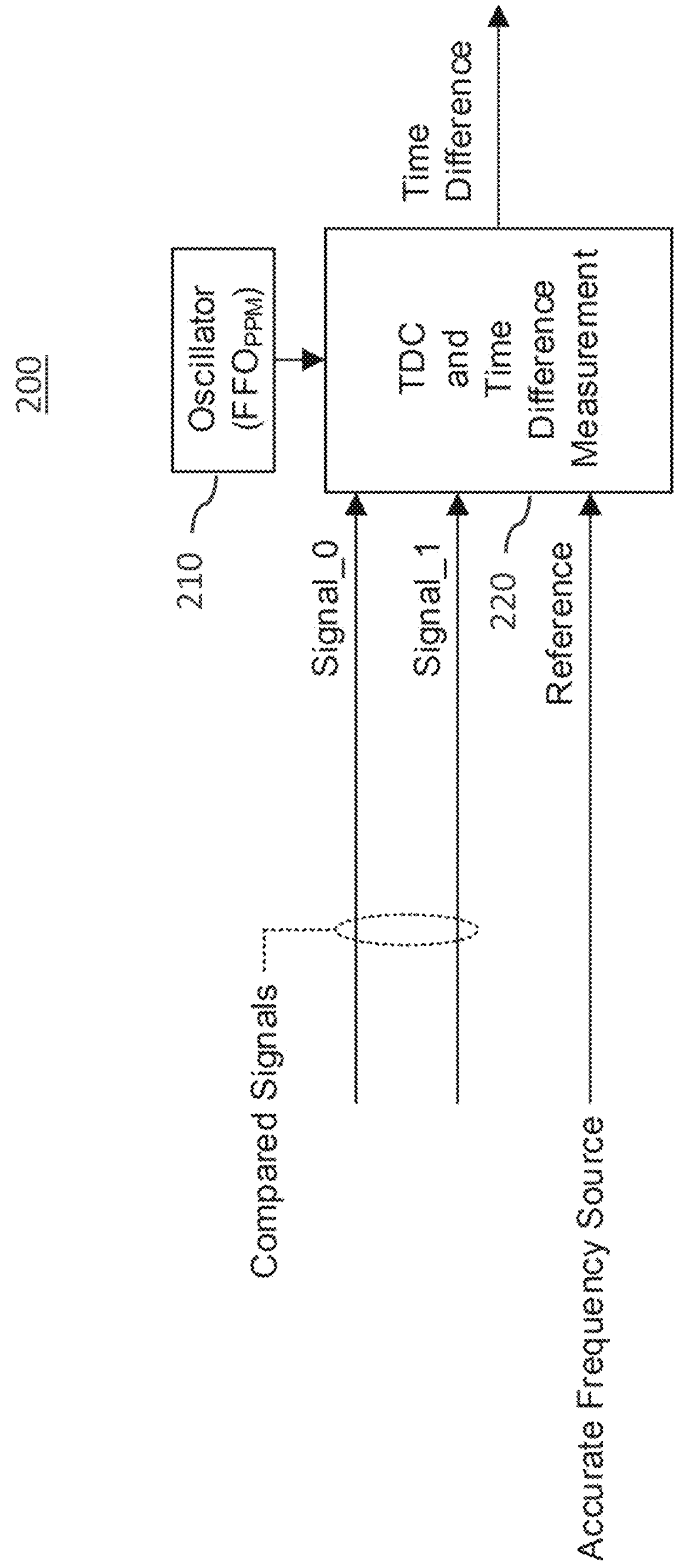
FIG. 5 is a diagram illustrating an example time difference measurement system using a reference-based on an accurate frequency source according to an embodiment.

With reference to FIG. 5, a timestamping method and system is disclosed that utilizes a periodic reference clock signal combined with a coarse/fine interpolation TDC such as that described above to achieve a precise timestamp measurement. FIG. 5 illustrates an example timing device 200 comprising an oscillator 210 and a TDC and time difference circuit 220. Oscillator 210 provides an oscillator clock signal to TDC and time difference circuit 220. TDC and time difference circuit 220 receives the oscillator clock signal, Signal_0, Signal_1 and a reference clock signal as inputs. Signal_0 and Signal_1 are the signals to be compared. The reference clock signal is generated by an accurate frequency source such as, e.g., a cesium oscillator, which may be part of timing device 200 or may be external to timing device 200. TDC and time difference circuit 220 is configured to generate a time difference based on the oscillator clock signal, Signal_0, Signal_1 and the reference signal as described below.

For example, TDC and time difference circuit 220 may be configured to perform the coarse/fine TDC as described above to provide a fixed coarse to fine period ratio, such that $P_f \times n = P_c$). In some embodiments, the reference clock signal may be external and come from an accurate frequency source with a low $FFO_{PPM}$ such that $U_{TD}$ can be reduced. Such an example embodiment is illustrated in FIG. 5. In this embodiment, the measured time difference between the compared signals Signal_0 and Signal_1 can be given in integer periods of the value of a reference clock signal counter plus a remainder based on the coarse/fine clock signal counters. The $U_{TD}$ of the measured time difference is reduced due to the low $FFO_{PPM}$ of the reference clock signal and the reduced magnitude of the time difference measured using the coarse/fine clock signals with their relatively high $FFO_{PPM}$.

The accurate frequency source may comprise, for example, an accurate oscillator in the same system as timing device 200, an accurate oscillator located in a remote system or any other source that provides a higher accuracy than the coarse/fine clock signals. A remotely located oscillator may be connected to timing device 200, e.g., via a wired network, a wireless network or in any other manner, with the reference recovered using clock recovery circuitry. In some embodiments, the remotely located oscillator may be connected to timing device 200 via a packet switched network with the reference recovered using protocols such as the Precision Time Protocol (PTP) IEEE 1588 or the network time protocol (NTP) or similar, and a clock recovery algorithm. In some embodiments, the accurate frequency source used to time the reference clock signal can be very accurate, e.g., with a $FFO_{PPM}$ of ±10-5 PPM.

Figure 6:
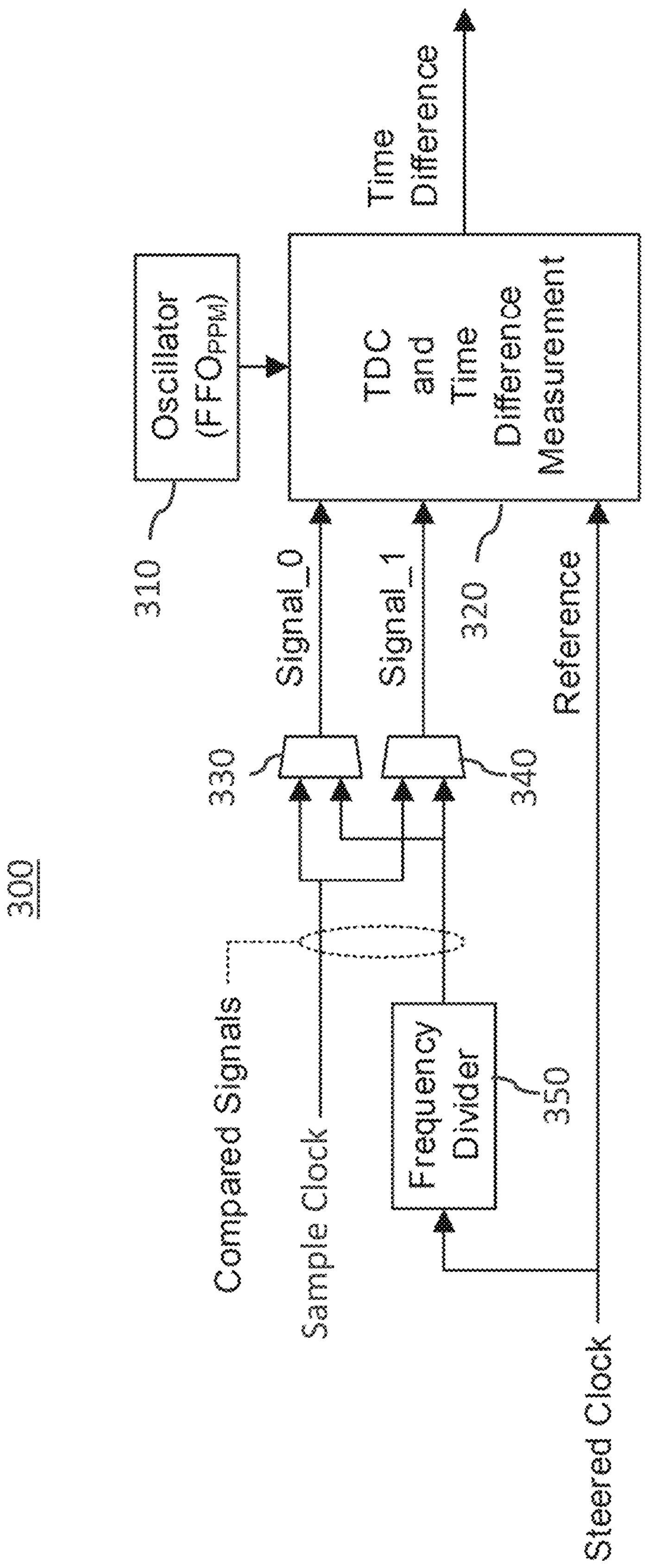
FIG. 6 is a diagram illustrating an example time difference measurement system using a reference-based on one of the compared signals according to an embodiment.

With reference to FIG. 6, in some embodiments, the reference clock signal may be generated by a steered periodic clock that may have its phase and frequency adjusted by a set of instructions, e.g., executed by a controller or other processing device such as a microcontroller or other processing circuitry. In an embodiment, one of the signals being compared may be a periodic clock signal generated by the steered clock with a frequency that is divided down from the frequency of the steered clock such that its period is a fixed multiple of the period of the steered clock. For example, FIG. 6 illustrates a timing device 300 comprising an oscillator 310, a TDC and time difference measurement circuit 320, a multiplexer 330, a multiplexer 340 and a frequency divider circuit 350. Oscillator 310 provides an oscillator clock signal to TDC and time difference measurement circuit 320.

Timing device 300 is configured to measure a time difference between signals Signal_0 and Signal_1 which can be given in integer periods of the steered clock plus a remainder based on the coarse/fine clock signals. Signal_0 and Signal_1 each correspond to one of a sample clock and the steered clock. In some embodiments, it may be valuable to reduce the time difference between the rising edges of Signal_0 and Signal_1 to a minimum value. For example, one of the sample clock and frequency divided steered clock may be selected for Signal_0 and the other may be selected for Signal_1 by multiplexers 330 and 340, e.g., based on which signal has a rising edge following the other signal with as short a time difference as possible. Hence, the waiting time for a measurement to complete can be minimized.

In applications where the objective is to reduce the time difference between the rising edge of the frequency divided steered clock signal and the rising edge of the sample clock signal to near zero, the phase of the frequency divided steered clock signal can be precisely adjusted by an integer number of the steered clock periods to eliminate most of the time difference without needing the steered clock to have a low $FFO_{PPM}$. The remainder of the time difference will be relatively small and subsequent TDC measurements will have a small $U_{TD}$ even if an inexpensive oscillator with relatively high $FFO_{PPM}$ is used. This allows a set of instructions executed by a controller or other processing device such as, e.g., a microprocessor or other processing circuitry, to make final precise fine phase adjustments to the steered clock to minimize the time difference between the rising edges of the signals.

Figure 7:
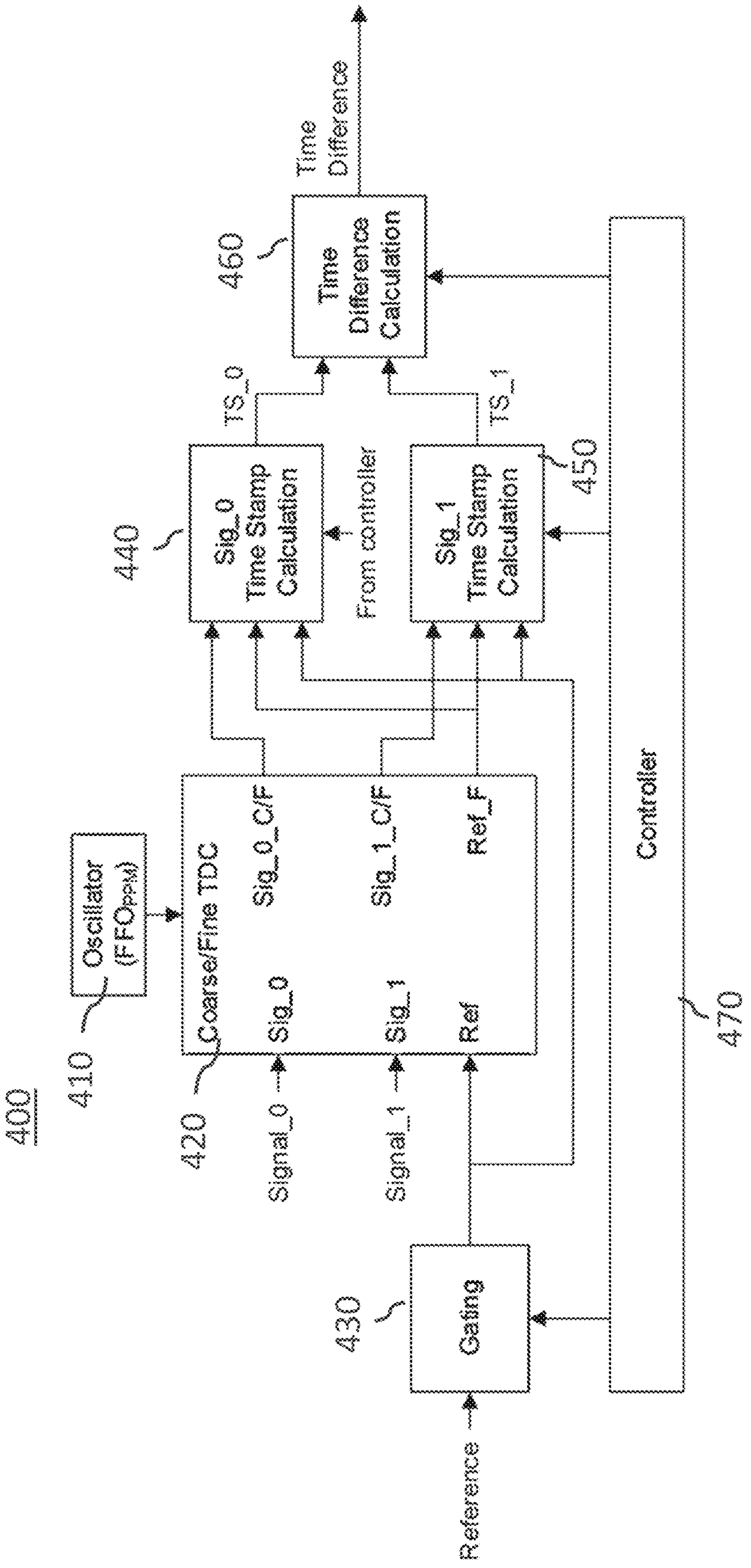
FIG. 7 is a diagram illustrating an example system for reference-based TDC timestamping and time difference measurements according to an embodiment.

With reference to FIG. 7, in some embodiments, the reference clock signal may be generated by a steered periodic clock that may have its phase and frequency adjusted by a set of instructions, e.g., executed by a processing device such as a microcontroller or other processing circuitry. In an embodiment, one of the signals being compared may be a periodic clock signal generated by the steered clock with a frequency that is divided down from the frequency of the steered clock such that its period is a fixed multiple of the period of the steered clock. For example, FIG. 7 illustrates a timing device 400 comprising an oscillator 410, a coarse and fine TDC circuit 420, a gating circuit 430, a Sig_0 time stamp determination circuit 440, a Sig_1 time stamp determination circuit 450, a time difference determination circuit 460 and a controller 470. Timing device 400 is configured to measure a time difference between signals Signal_0 and Signal_1.

Oscillator 410 provides an oscillator clock signal to coarse and fine TDC circuit 420, e.g., in a similar manner to that described above for oscillator 12. Coarse and fine TDC circuit 420 receives the oscillator clock signal, Signal_0, Signal_1 and a reference clock signal as inputs. The reference clock signal is generated, for example, by an accurate frequency source such as, e.g., a cesium oscillator, which may be part of timing device 400 or may be external to timing device 400. In the embodiment of FIG. 7, the reference clock signal is gated by gating circuit 430 under control of controller 470. Coarse and fine TDC circuit 420 is configured to generate internal timestamps Sig_0_C/F for Signal_0, internal timestamps Sig_1_C/F for Signal_1 and internal timestamps Ref_F for the reference clock signal.

Sig_0 time stamp determination circuit 440 receives Sig_0_C/F, Ref_F, the reference clock signal, and a control signal from controller 470 as inputs and is configured to generate a time stamp TS_0 for Signal_0 as an output. Sig_1 time stamp determination circuit 450 receives Sig_1_C/F, Ref_F, the reference clock signal, and a control signal from controller 470 as inputs and is configured to generate a time stamp TS_1 for Signal_1 as an output. Time difference determination circuit 460 receives TS_0, TS_1 and a control signal from controller 470 as inputs and is configured to generate a time difference as an output. Controller 470 comprises, for example, a state machine, a processor, central processing unit (CPU), field-programmable gate array (FPGA) or any other circuitry that is configured to control and operate timing device 400.

Figure 8:
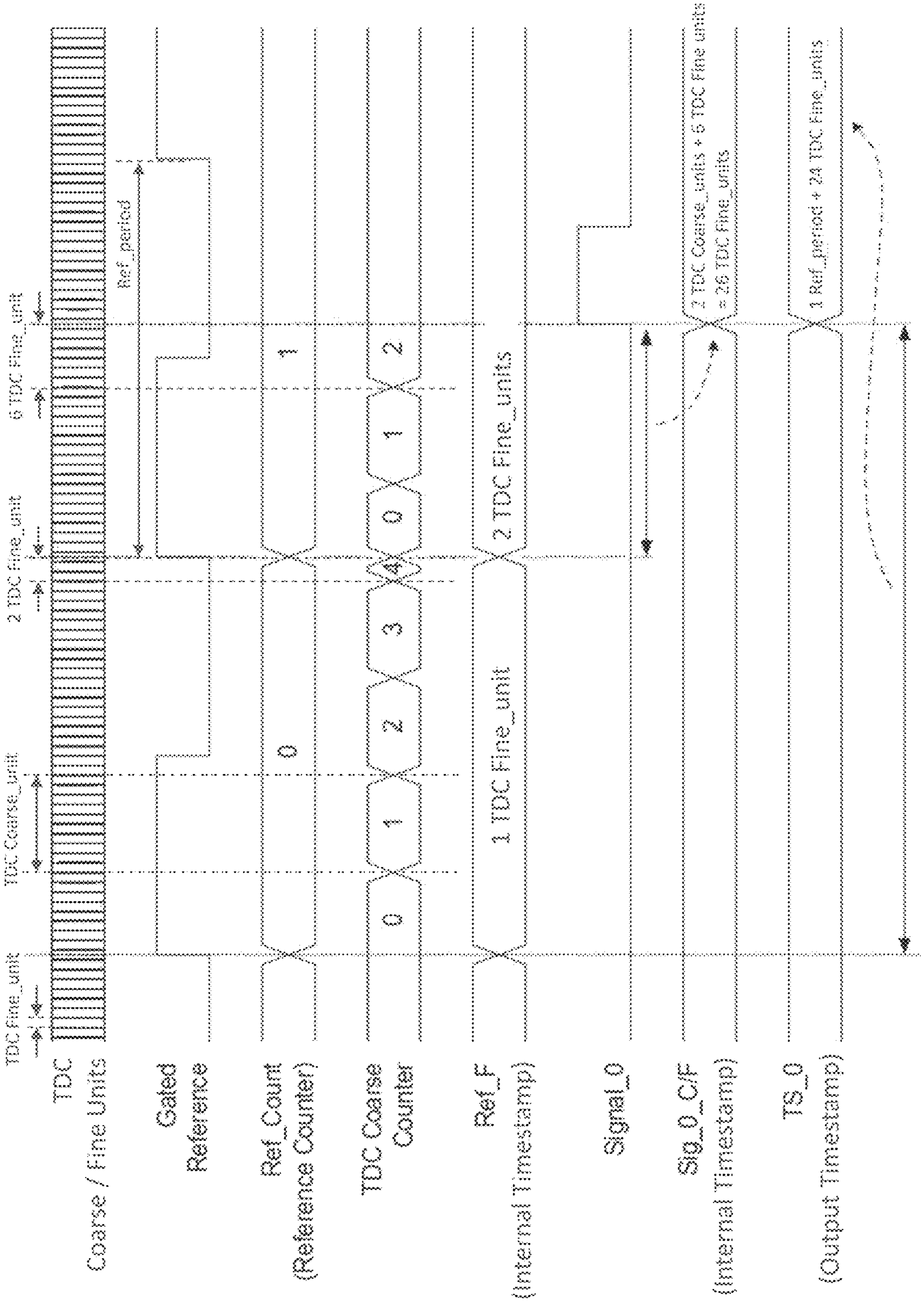
FIG. 8 is a signal diagram illustrating an example reference-based time stamp determination based on the system of FIG. 7 according to an embodiment.

With reference also to FIG. 8, upon receiving a measurement request, controller 470 is configured to gate the reference clock signal using gating circuit 430 and turn on the time stamp determination and time difference determination circuits 440, 450 and 460. Within coarse and fine TDC circuit 420, every time a gated reference clock signal rising edge is detected, the TDC coarse counter is reset to zero and the gated reference clock signal rising edge samples and latches the value of the reference TDC fine counter to create an internal timestamp labeled as Ref_F. A rising edge on the Signal_0 input latches the values of the TDC coarse counter and the TDC fine counter to create another internal timestamp labeled as Sig_0_C/F. A rising edge on the Signal_1 input (not shown in FIG. 8) latches the values of the TDC coarse counter and the TDC fine counter to create another internal timestamp labeled as Sig_1_C/F (not shown in FIG. 7). The internal timestamps Ref_F, Sig_0_C/F and Sig_1_C/F can be digital words.

Following a rising edge on Signal_0, the internal timestamps Ref_F and Sig_0_C/F values are passed to time stamp determination circuit 440. Time stamp determination circuit 440 determines and returns the Signal_0 output time stamp (TS_0) which comprises the reference counter value and the difference between the internal timestamps Ref_F and Sig_0_C/F in TDC fine units. The conversion from Sig_0_C/F to TDC Fine units is relatively simple because the coarse period is an integer multiple of the fine period. The flow for determining the TS_1 output timestamp for a rising edge on Signal_1 follows the same process as for determining the TS_0 output timestamp.

Applying equation (14), the time stamp uncertainty for reference-based timestamping ($U_{RTS}$) can be approximated using equation (15), where $P_R$ is the period of the reference clock in seconds, $P_f$ is the period of the fine clock in seconds, Ref_Count is the number of reference periods counted during the measurement, Fine_units is the number of fine clock periods counted during the measurement, $FFO_{PPM\_REF}$ is the frequency uncertainty of the reference, and $FFO_{PPM\_TDC}$ is the frequency uncertainty of the oscillator timing the TDC.

$$U_{RTS} \approx \pm\left(P_R \times \text{Ref\_Count} \times FFO_{PPM\_REF} \times 10^{-6} + P_f \times \text{Fine\_units} \times FFO_{PPM\_TDC} \times 10^{-6}\right) \quad (15)$$

Figure 9:
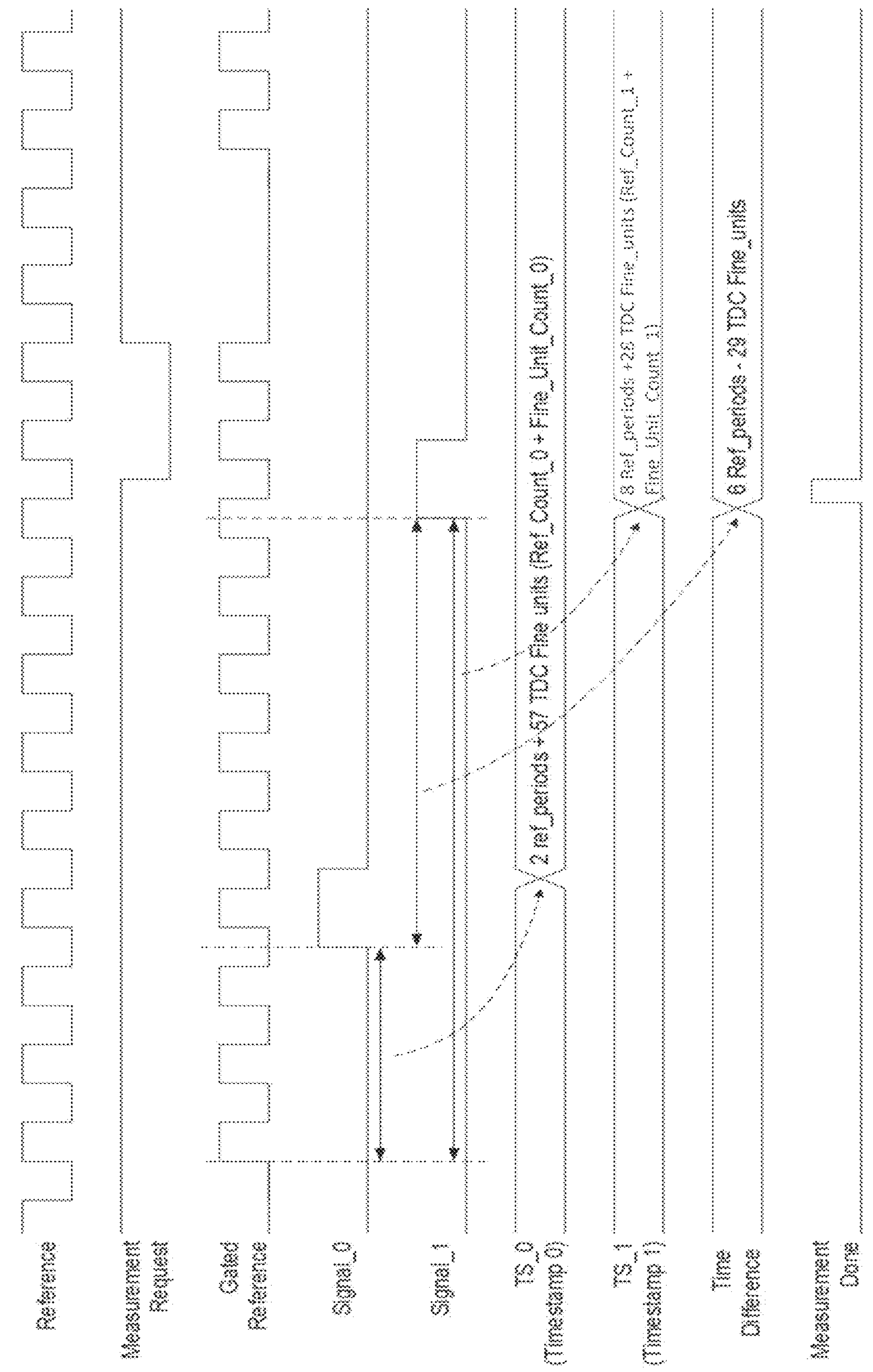
FIG. 9 is a signal diagram illustrating an example reference-based time difference measurement based on the system of FIG. 7 according to an embodiment.

With reference also to FIG. 9, when measuring time differences between rising edges on Signal_0 and Signal_1, in some embodiments, a positive value (i.e., Signal_0 leads Signal_1) may be ensured by having the coarse and fine TDC for Signal_1 ignore edges on Signal_1 until after the coarse and fine TDC for Signal_0 has detected a rising edge on Signal_0. This arm/trigger approach also allows for measuring time differences between two signals of different, but integer-related, frequencies since the lower frequency signal can be used as the trigger, or first measured, signal (e.g., Signal_0 in this case).

Once both edges have been timestamped, the time difference determination circuit 460 subtracts TS_0 from TS_1, providing a time difference measurement in reference cycles and TDC Fine units. Time difference measurements using this process do not rely on the frequency accuracy of the coarse and fine TDC clocks for longer than one reference period.

The uncertainty of the time difference measurement ($U_{RTD}$) can be approximated using equation (16) below where ΔRef_Count and ΔFine_units are the differences in the Ref_Count and Fine_units respectively from subtracting TS_0 from TS_1.

$$U_{RTD} \approx \pm\left(P_R \times (\Delta\text{Ref\_Count}) \times FFO_{PPM\_REF} \times 10^{-6} + P_f \times \Delta\text{Fine\_units} \times FFO_{PPM\_TDC} \times 10^{-6}\right) \quad (16)$$

With this architecture, the maximum value of ($P_f \times$ ΔFine_units) is equivalent to a single $P_R$, therefore $U_{RTD}$ can be approximated using equation (17):

$$U_{RTD} \approx \pm\left(P_R \times (\Delta\text{Ref\_Count}) \times FFO_{PPM\_REF} \times 10^{-6} + P_R \times FFO_{PPM\_TDC} \times 10^{-6}\right) \quad (17)$$

Assuming, for example, that $FFO_{PPM\_REF}=10^{-5}$ PPM, $FFO_{PPM\_TDC}=200$ PPM, $P_R=1$ μs, and $\Delta\text{Ref\_Count}=10^6-1$ and using Equation (17), for a 1 s time difference measurement $U_{RTD} \approx \pm 2$ ps which is much lower than the $U_{TD}$ of ±200 μs for a coarse and fine TDC without the use of a reference clock when making a similar measurement.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:

a time-to-digital converter circuit that is configured to:

obtain an oscillator clock signal from an oscillator;

generate a coarse clock signal based on the oscillator clock signal, the coarse clock signal having a period linearly related to a period of the oscillator clock signal;

generate a fine clock signal based on an interpolation of the coarse clock signal, the fine clock signal having a plurality of periods for each period of the coarse clock signal;

obtain a first clock signal;

obtain a second clock signal;

obtain a reference clock signal, the reference clock signal having a smaller frequency uncertainty than the oscillator clock signal;

determine a first timestamp of an edge of the first clock signal based on the first clock signal, the coarse clock signal, the fine clock signal and the reference clock signal;

determine a second timestamp of an edge of the second clock signal based on the second clock signal, the coarse clock signal, the fine clock signal and the reference clock signal; and output a time difference between the first and second timestamps, the time difference comprising a reference component generated based on the reference clock signal and a coarse and fine component generated based on the coarse and fine clock signals.

2. The apparatus of claim 1, wherein the coarse and fine clock signals inherit a frequency uncertainty of the oscillator clock signal.

3. The apparatus of claim 1, wherein the first clock signal and the second clock signal are obtained from sources independent of the reference clock signal.

4. The apparatus of claim 1, wherein one of the first clock signal and the second clock signal is obtained from a source independent of the reference clock signal and the other of the first clock signal and the second clock signal is generated based on the reference clock signal.

5. The apparatus of claim 4, wherein the other of the first clock signal and the second clock signal is generated based on the reference clock signal using a frequency divider circuit.

6. The apparatus of claim 1, wherein the reference clock signal is gated by a gating circuit under control of a controller.

7. The apparatus of claim 1, wherein the time-to-digital converter circuit is further configured to:

reset a coarse counter to zero based on a detection of an edge of the reference clock signal;

latch a value of a reference fine counter based on the detection of the edge of the reference clock signal;

latch a value of the coarse counter based on a detection of an edge of the first clock signal; and latch a value of the reference fine counter based on a detection of an edge of the first clock signal.

8. The apparatus of claim 1, wherein:

the second clock signal has a higher frequency than the first clock signal; and the time-to-digital converter circuit is further configured to ignore detection of an edge of the second clock signal until after an edge of the first clock signal has been detected.

9. The apparatus of claim 1, wherein the first and second timestamps each comprise a reference count value component and a coarse and fine count value component.

10. A method of determining a time difference by a time-to-digital converter circuit comprising:

obtaining an oscillator clock signal from an oscillator;

generating a coarse clock signal based on the oscillator clock signal, the coarse clock signal having a period linearly related to a period of the oscillator clock signal;

generating a fine clock signal based on an interpolation of the coarse clock signal, the fine clock signal having a plurality of periods for each period of the coarse clock signal;

obtaining a first clock signal;

obtaining a second clock signal;

obtaining a reference clock signal, the reference clock signal having a smaller frequency uncertainty than the oscillator clock signal;

determining a first timestamp of an edge of the first clock signal based on the first clock signal, the coarse clock signal, the fine clock signal and the reference clock signal;

determining a second timestamp of an edge of the second clock signal based on the second clock signal, the coarse clock signal, the fine clock signal and the reference clock signal; and outputting a time difference between the first and second timestamps, the time difference comprising a reference component generated based on the reference clock signal and a coarse and fine component generated based on the coarse and fine clock signals.

11. The method of claim 10, wherein the coarse and fine clock signals inherit a frequency uncertainty of the oscillator clock signal.

12. The method of claim 11, wherein the other of the first clock signal and the second clock signal is generated based on the reference clock signal using a frequency divider circuit.

13. The method of claim 10, wherein the first clock signal and the second clock signal are obtained from sources independent of the reference clock signal.

14. The method of claim 10, wherein one of the first clock signal and the second clock signal is obtained from a source independent of the reference clock signal and the other of the first clock signal and the second clock signal is generated based on the reference clock signal.

15. The method of claim 10, wherein the reference clock signal is gated by a gating circuit under control of a controller.

16. The method of claim 10, further comprising:

resetting a coarse counter to zero based on a detection of an edge of the reference clock signal;

latching a value of a reference fine counter based on the detection of the edge of the reference clock signal;

latching a value of the coarse counter based on a detection of an edge of the first clock signal; and latching a value of the reference fine counter based on a detection of an edge of the first clock signal.

17. The method of claim 10, wherein:

the second clock signal has a higher frequency than the first clock signal; and the method further comprises ignoring detection of an edge of the second clock signal until after an edge of the first clock signal has been detected.

18. The method of claim 10, wherein the first and second timestamps each comprise a reference count value component and a coarse and fine count value component.

19. A semiconductor device comprising:

an oscillator;

a coarse and fine time-to-digital converter circuit that is configured to receive an oscillator clock signal, a first clock signal, a second clock signal and a gated reference clock signal as inputs and to output a first timestamp corresponding to the first clock signal, a second timestamp corresponding to the second clock signal and a third timestamp corresponding to a reference fine clock signal;

a first clock signal timestamp determination circuit that is configured to receive the first, second and third timestamps and to output a first output timestamp corresponding to the first clock signal based on the received first, second and third timestamps;

a second clock signal timestamp determination circuit that is configured to receive the first, second and third timestamps and to output a second output timestamp corresponding to the second clock signal based on the received first, second and third timestamps;

a time difference determination circuit that is configured to receive the first output timestamp and the second output timestamp and to output a time difference that is determined based on the first output timestamp and the second output timestamp;

a gating circuit that is configured to receive a reference clock signal as an input and output the gated reference clock signal based on the received gated reference clock signal; and a controller that is configured to control operations of one or more of the gating circuit, the first clock signal timestamp determination circuit, the second clock signal timestamp determination circuit and the time difference determination circuit.

20. The semiconductor device of claim 19, wherein the first and second output timestamps each comprise a reference count value component and a coarse and fine count value component.

* * * * *